United States Patent [19]

Iwasaki et al.

[11] Patent Number: 4,584,260
[45] Date of Patent: Apr. 22, 1986

[54] PHOTOPOLYMERIZABLE COMPOSITIONS WITH COMBINED PHOTOINITIATORS

[75] Inventors: Masayuki Iwasaki; Minoru Maeda; Fumiaki Shinozaki, all of Shizuoka, Japan

[73] Assignee: Fuji Photo Film Co., Ltd., Kanagawa, Japan

[21] Appl. No.: 741,721

[22] Filed: Jun. 6, 1985

Related U.S. Application Data

[63] Continuation of Ser. No. 546,662, Oct. 28, 1983, abandoned.

[30] Foreign Application Priority Data

Oct. 28, 1982 [JP] Japan .................................. 57-189536

[51] Int. Cl.$^4$ .............................................. G03C 1/68
[52] U.S. Cl. .................................... 430/288; 430/281; 430/919; 430/923; 430/925; 430/920; 522/47; 522/48
[58] Field of Search ............... 430/281, 288, 919, 923, 430/925, 920; 204/159.18, 159.23

[56] References Cited

U.S. PATENT DOCUMENTS

| | | | |
|---|---|---|---|
| 3,661,588 | 5/1972 | Chang | 430/281 |
| 4,043,887 | 8/1977 | Picifici et al. | 430/925 |
| 4,080,275 | 3/1978 | Photis et al. | 430/281 |
| 4,113,592 | 9/1978 | Pybny et al. | 430/281 |
| 4,147,604 | 4/1979 | Kuesters et al. | 430/281 |
| 4,189,323 | 2/1980 | Buhr | 430/281 |
| 4,239,850 | 12/1980 | Kita et al. | 430/281 |
| 4,279,982 | 7/1981 | Iwasaki et al. | 430/281 |

Primary Examiner—Jack P. Brammer
Attorney, Agent, or Firm—Sughrue, Mion, Zinn, MacPeak and Seas

[57] ABSTRACT

A photopolymerizable composition comprising an addition polymerizable unsaturated compound containing at least two ethylenically unsaturated double bonds in the molecule thereof and photopolymerization initiators, wherein a 4,4'-bis(dialkylamino)benzophenone represented by general formula I below, a benzophenone derivative represented by general formula II below and a compound having a group represented by general formula III below are contained as said photopolymerization initiators:

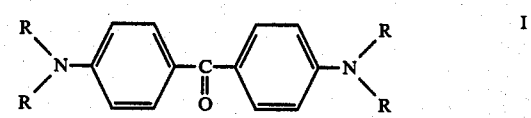

wherein R represents an alkyl, cycloalkyl or hydroxyalkyl group having 1 to 6 carbon atoms or is combined with another R substituted on the same nitrogen atom to form tetramethylene, pentamethylene or oxybisethylene;

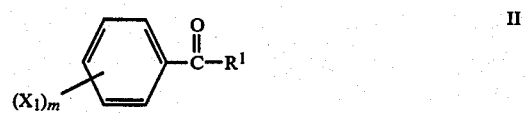

wherein $R^1$ represents a hydrogen atom

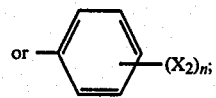

$X_1$ and $X_2$ each represents an alkyl group, an alkoxy group, a carboxy group, an alkoxycarbonyl group, an aryloxycarbonyl group or a halogen atom; m and n each represents 0, 1 or 2 and when m and n each represents 2, $X_1$ and $X_2$ may be the same or different;

—CY$_3$   III wherein Y represents a halogen atom.

12 Claims, No Drawings

PHOTOPOLYMERIZABLE COMPOSITIONS WITH COMBINED PHOTOINITIATORS

This is a continuation of application Ser. No. 546,662, filed Oct. 28, 1983, now abandoned.

FIELD OF THE INVENTION

The present invention relates to a photopolymerizable composition comprising a photopolymerization initiator system in a novel combination. More particularly, the present invention relates to a photopolymerizable composition having high sensitivity which provides a photohardenable layer having excellent layer strength, suited for utilities as a lithographic printing plate, a resin relief printing, a resist for preparing a printed based plate, a photomasking, etc.

BACKGROUND OF THE INVENTION

A photopolymerizable composition is principally composed of a photopolymerizable initiator and a polyfunctional monomer. Upon irradiation with light, the photopolymerizable composition is hardened and insolubilized in a solvent. Utilizing this property, photopolymerizable compositions have been widely utilized in photography, printing, metal surface finishing, ink, etc. (J. Kosar, *Light Sensitive Systems*, 1965, published by J. Wiley & Sons, New York).

Heretofore investigations have been made to improve the sensitivity of a photopolymerizable composition to light and many photopolymerization initiators have been proposed. Examples of such photopolymerization initiators include benzoin ethers described in U.S. Pat. No. 2,722,512; anthraquinones described in U.S. Pat. No. 3,046,127; aminophenyl ketones and active methylene or amino compounds described in Japanese Patent Publication 11936/74 (corresponding to U.S. Pat. No. 3,661,588); Michler's ketones and benzophenone described in U.S. Pat. No. 3,682,641; benzophenone and 4-N,N-dimethylaminobenzophenone described in Japanese Patent Publication 16725/75; etc. When these photopolymerization initiators are employed, the improvement in light sensitivity is indeed noted but, dynamic properties of the resulting light hardened matters (particularly hardened matters in a layer form) were not alway satisfactory for various utilities.

For example, in the case of using the hardened matter as a dry film resist employed in preparation of a printed circuit base plate, the layer strength after photohardening was insufficient. Dry film resists employed for preparing printed circuit base plates are described in Japanese Patent Publication 25231/69 (corresponding to U.S. Pat. No. 3,469,982) and more detailed use is described in, e.g., W. S. De Forest, *Photoresist*, pp. 163 to 212 (1975), published by McGraw-Hill, New York. A main object of using a dry film resist is to prepare a through hole by tenting but in the case of conventional known photopolymerization initiators, troubles of breaking layers at steps of development and etching often occur due to insufficient strength of a tenting layer.

SUMMARY OF THE INVENTION

Accordingly an object of the present invention is to provide a photopolymerizable composition which provides a photohardenable layer having excellent strength.

Another object of the present invention is to provide a photopolymerizable composition having high light sensitivity.

These and other objects of the present invention will be apparent from the following descriptions of the present invention.

As a result of extensive investigations, the present inventors have found a photopolymerizable composition comprising photopolymerization initiators in a novel combination which can achieve the foregoing objects.

That is, the objects of the present invention are achieved by a photopolymerizable composition comprising an addition polymerizable unsaturated compound containing at least two ethylenically unsaturated double bonds in the molecule thereof (polyfunctional monomer) and photopolymerization initiators wherein a 4,4'-bis(dialkylamino)-benzophenone represented by general formula I described below, a benzophenone derivative represented by general formula II described below and a compound having a group represented by general formula III described below are contained as the photopolymerization initiators.

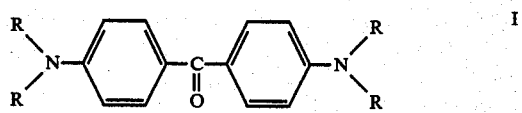

wherein R represents an alkyl, cycloalkyl or hydroxyalkyl group having 1 to 6 carbon atoms, or is combined with another R substituted on the same nitrogen atom to form tetramethylene, pentamethylene or oxybisethylene.

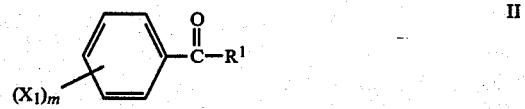

wherein $R^1$ represents a hydrogen atom or

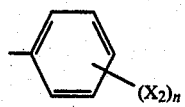

$X_1$ and $X_2$ each represents an alkyl group, an alkoxy group, a carboxy group, an alkoxycarbonyl group, an aryloxycarbonyl group or a halogen atom; m and n each represents 0, 1 or 2 and when m and n each represents 2, $X_1$ and $X_2$ may be the same or different.

wherein Y represents a halogen atom.

PREFERRED EMBODIMENTS OF THE INVENTION $X_1$ and $X_2$ each preferably has 1 to 6 carbon atoms in an alkyl moiety, 6 to 10 carbon atoms in an aryl moiety, and it may be Cl, Br, F or I when it represents a halogen atom.

Preferred examples of compounds represented by general formula I which are employed in the present invention include 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4,4'-bis(morpholino)benzophenone, etc.

Preferred examples of benzophenone derivatives represented by general formula II include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenonetetracarboxylic acid or a tetramethyl ester thereof. Of these, benzophenone is particularly preferred.

As compounds containing the group of general formula III, compounds selected from the following compounds represented by general formulae IIIa to IIIe are preferred.

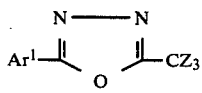
    IIIa

Ar$^1$: a substituted or unsubstituted phenyl or naphthyl group
Z: a chlorine or bromine atom

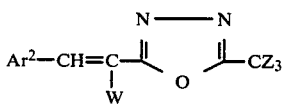
    IIIb

Ar$^2$: a substituted or unsubstituted aryl group
W: a hydrogen atom, an alkyl group or an aryl group
Z: a chlorine or bromine atom

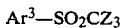
    IIIc

Ar$^3$: a substituted or unsubstituted phenyl or naphthyl group
Z: a chlorine or bromine atom

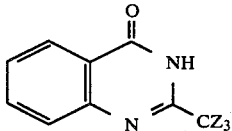
    IIId

Z: a chlorine or bromine atom

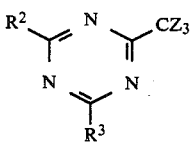
    IIIe

R$^2$: CZ$_3$ or a substituted or unsubstituted phenyl or naphthyl group
R$^3$: CZ$_3$, NH$_2$, NHR$^4$, N(R$^4$)$_2$, SR$^4$, OR$^4$, R$^4$
R$^4$: an alkyl, aryl or alkenyl group
Z: a chlorine or bromine atom Preferred examples of substituents an Ar$^1$ include an alkyl group having 1 to 6 carbon atoms, an alkoxy group having 1 to 6 carbon atoms, Cl, Br, F NO$_2$, CN, and methylene dioxy group.

Preferred examples of substituents in Ar$^2$ include an alkyl group having 1 to 6 carbon atoms, an alkoxy group having 1 to 6 carbon atoms, Cl, Br, F, NO$_2$, CN, phenyl group, phenoxy group and acetoxy group.

W preferably has 1 to 6 carbon atoms when it represents an alkyl group and 6 to 10 carbon atoms when it represents an aryl group.

Preferred examples of substituents in Ar$^3$ include an alkyl group having 1 to 6 carbon atoms, an alkoxy group having 1 to 6 carbon atoms, Cl, Br, F, and NO$_2$.

Preferred examples of substituents in R$^2$ include an alkyl group having 1 to 6 carbon atoms, an alkoxy group having 1 to 6 carbon atoms, Cl, Br, F, NO$_2$, and CN.

R$^4$ preferably has 1 to 6 carbon atoms when it represents an alkyl group or alkenyl group, and 6 to 10 carbon atoms when it represents an aryl group.

Compounds of general formula IIIa are compounds described in Japanese Patent Application (OPI) 77742/80 (corresponding to U.S. Pat. No. 4,279,982) and preferred examples of such compounds include 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, etc. Of these, particularly preferred are 2-trichloromethyl-5-(1-naphthyl)-1,3,4-oxadiazole and 2-trichloromethyl-5-(4-chlorophenyl)-1,3,4-oxadiazole.

Compounds represented by general formula IIIb are compounds described in Japanese Patent Application OPI 74728/79 (corresponding to U.S. Pat. No. 4,232,106) and preferred examples of such compounds include 2-trichloromethyl-5-styryl-1,3,4-oxadiazole, 2-trichloromethyl-5-(4-chlorostyryl)-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthylvinyl)-1,3,4-oxadiazole, 2-trichloromethyl-5-(4-n-butoxystyryl)-1,3,4-oxadiazole, 2-tribromomethyl-5-styryl-1,3,4-oxadiazole, etc. Of these, particularly preferred are 2-trichloromethyl-5-(4-chlorostyryl)-1,3,4-oxadiazole and 2-trichloromethyl-5-(4-n-butoxystyryl)-1,3,4-oxadiazole.

Specific examples of compounds represented by general formula IIIc include phenyltribromomethylsulfone, p-nitrophenyltribromomethylsulfone, p-chlorophenyltribromomethylsulfone, etc. Of these, particularly preferred is phenyltribromomethylsulfone.

Specific examples of compounds represented by general formula IIId include 2-trichloromethylquinazoline, 2-tribromomethylquinazolinone, etc. Of these, 2-trichloromethylquinazolinone is particularly preferred.

Compounds represented by general formula IIIe are compounds described in Japanese Patent Application OPI 74887/79 (corresponding to U.S. Pat. No. 4,239,850) and specific examples of such compounds include 2,4,6-tris(trichloromethyl)-s-triazine, 2-phenyl-4,6-bis(trichloromethyl)-s-triazine, 2-(4-methoxyphenyl)-4,6-bis(trichloromethyl)-s-triazine, 2-(4-trichlorophenyl)-4,6-bis(tribromomethyl)-s-triazine, etc. Of these, particularly preferred are 2,4,6-tris(trichloromethyl)-s-triazine and 2-(4-methoxyphenyl)-4,6-bis(trichloromethyl)-s-triazine.

Representative examples of polyfunctional monomers which are suitably employed in the photopolymerizable composition of the present invention include acrylic acid or methacrylic acid esters of polyols described in Japanese Patent Publications 5093/60, 14719/60 and 28727/69 (corresponding to U.S. Pat. No. 3,486,903), etc., i.e., diethyleneglycol di(meth)acrylate, triethyleneglycol di(meth)acrylate, tetraethyleneglycol di(meth)acrylate, pentaerythritol tri(meth)acrylate, trimethylolpropane tri(meth)acrylate, dipentaerythritol hexa(meth)acrylate, 1,6-hexanediol di(meth)acrylate, etc., or bis(meth)acrylamides such as methylenebis(meth)acrylamide and ethylenebis(meth)acrylamide or polyfunctional monomers containing urethane groups therein, eg., di-(2-methacryloxyethyl)-2,4-tolylenediurethane, di-(2-acryloxyethyl)hexamethylenediurethane, etc., or (meth)acrylurethane oligomers obtained by previously reacting polyols with diisocyanates and further reacting the resulting terminal isocyanate compounds with β-hydroxyalkyl(meth)acrylates, etc.

The photopolymerizable composition in accordance with the present invention comprises as essential components the photopolymerization initiators and the polyfunctional monomers as described above but, if necessary and desired, may further contain high molecular binders, thermal polymerization inhibitors, plasticizers, dyestuffs, color changing agents, unsaturated compounds having one ethylenically unsaturated double bond, adhesion accelerators to the surface such as anodized aluminum oxide, copper, etc. and other auxiliary agents, etc., in combination. Thus, the desired lithographic printing plates, resin relief plates, photoresists, photomasks, etc. can be widely prepared.

The high molecular binders described above are employed for purposes of improving printability or physical properties of resists and typical examples of such high molecular binders include alkyd or polyester resins which may be saturated or unsaturated, modified or unmodified, vinyl resins, acryl resins, epoxy resins, xylene resins, aromatic sulfonamide-formaldehyde resins, ketone resins, petroleum resins, diallyl phthalate resins, melamine resins, rosin-modified phenol resins, natural resins such as cellulose or cellulose derivatives, etc. Particularly preferred examples of binders are alchol-soluble nylons, poly(methyl methacrylate), methyl methacrylate-methacrylic acid copolymer, etc.

Thermal polymerization prevention agents are added for purposes of preventing thermal polymerization or polymerization with the passage of time in the photopolymerizable composition of the present invention and typical examples of such prevention agents include p-methoxyphenol, hydroquinone, t-butylcatechol, pyrogallol, 2-hydroxbenzophenone, 4-methoxy-2-hydroxybenzophenone, cuprous chloride, phenothiazine, chloranil, napthylamine, β-naphthol, 2,6-di-t-butyl-p-cresol, nitrobenzene, dinitrobenzene, picric acid, p-toluidine, etc.

Plasticizers are added for purpose of controlling properties of layers and typical examples of plasticizers include phthalic acid esters such as dibutyl phthalate, diheptyl phthalate, dioctyl phthalate, dially phthalate, etc.; glycol esters such as triethylene glycol diacetate, tetraethylene glycol diacetate, etc.; phosphoric acid esters such as tricresyl phosphate, triphenyl phosphate, etc.; amides such as p-toluenesulfonamide, benzonesulfonamide, N-n-butylacetamide, etc.; aliphatic dibasic acid esters such as diisobutyl adipate, dioctyl adipate, dimethyl sebacate, dioctyl azelate, dibutyl maleate, etc.; triethyl citrate, tributyl citrate, glycerine triacetyl ester, butyl laurate, dioctyl 4,5-diepoxycyclo-hexane-1,2-dicarboxylate, etc.

Specific examples of dyestuffs include brilliant green, eosine, ethyl violet, erythrosine B, methyl green, crystals violet, basic fuchsine, phenolphthalein, 1,3-diphenyltriazine, arizarin red S, thymol phthalein, methyl violet 2B, quinaldine red, rose bengal, metanil yellow, thymol sulfophthalein, xylenol blue, methyl orange, orange IV, diphenylthiocarbazone, 2,7-dichlorofluorescein, paramethyl red, congo red, benzopurpurine 4B, α-naphthyl red, Nile blue A, phenacetol, methyl violet, malachite green, parafuchsine, oil blue #603 (made by Orient Chemical Industry Co., Ltd.), rhodamine B, rhodamine 6G, etc.

Color changing agents are added to the photopolymerizable composition such that visible images be provided upon exposure to light. Specific examples of these color changing agents include, in addition to the foregoing dyestuffs, diphenylamine, dibenzylaniline, triphenylamine, diethylaniline, diphenyl-p-phenylenediamine, p-toluidine, 4,4′-biphenyldiamine, o-chloroaniline, tris[p-(N,N′-dimethylamino)phenyl]methane, bis[p-(N,N′-dimethylamino)-phenyl]phenyl]methane, p,p′,p″-triaminotriphenylcarbinol, etc.

The unsaturated compounds having one ethylenically unsaturated double bond are employed for purposes of improving sensitivity or properties of resists and typical examples of such compounds include ethylene glycol mono(meth)acrylate, triethylene glycol methyl ether (meth)acrylate, ethylene glycol phenyl ether (methy)acrylate, tetraethylene glycol mono(meth)acrylate, diacetone acrylamide, (meth)acrylamide, N-n-butyl (meth)acrylamide, etc.

Specific examples of adhesion accelerators include compounds described in Japanese Patent Publication 9177/75 (corresponding to U.S. Pat. No. 3,622,334) such as benzimidazole, benzthiazole, benzoxazole, benztriazole, etc.; compounds described in Japanese Patent Application OPI 702/78 such as 2-mercaptobenzothiazole, 2-mercaptobenzimidazole, etc.

Preferred or usually used proportions and particularly preferred proportions of the respective constituent components described above are shown below with parts by weight based on 100 parts by weight of the polyfunctional monomer.

|  | Preferred Range | Particularly Preferred Range |
|---|---|---|
| Compound of general formula I | 0.01–100 | (0.1–50) |
| Compound of general formula II | 0.01–100 | (0.1–50) |
| Compound of general formula III | 0.01–100 | (0.1–50) |

|  | Usually Used Range | Preferred Range |
|---|---|---|
| High molecular binder | not more than 10000 | (10–1000) |
| Thermal polymerization prevention agent | not more than 50 | ($1 \times 10^{-4}$–20) |
| Plasticizer | not more than 1000 | (5–100) |
| Dyestuff | not more than 100 | (0.01–50) |
| Color changing agent | not more than 100 | (0.1–50) |
| Ethylenically unsaturated compound | not more than 1000 | (1–100) |
| Adhesion accelerator | not more than 50 | (0.1–20) |

Preferable weight ratio and particularly preferable weight ratio between two compounds represented by the general formula (I), (II) or (III) to the other compound are as follows:

| Compound | Preferred Range | Particularly Preferred Range |
| --- | --- | --- |
| Formula (I): Formula (II) = | 1:20 to 10:1 | 1:15 to 5:1 |
| Formula (I): Formula (III) = | 1:20 to 10:1 | 1:15 to 5:1 |
| Formula (II): Formula (III) = | 1:10 to 10:1 | 1:5 to 5:1 |

The total amount of compounds represented by formulae (I), (II) and (III) is preferably 1 to 30 parts by weight, more preferably 5 to 20 parts by weight per 100 parts by weight of the polyfunctionaly monomer.

The photopolymerizable composition of the present invention is provided for use by dissolving the foregoing various constituent components in a solvent and coating the solution in a desired support in a conventional manner. As solvents used in this case, there are ethylene dichloride, monoclorobenzene, cyclohexanone, methyl ethyl ketone, acetone, methyl acetate cellosolve, ethyl acetate, methyl acetate, methyl cellosolve, toluene, xylene, etc., singly or as a mixture thereof.

The photopolymerizable composition of the present invention is suited for a photoresist layer of a dry film resist. In this case, it is suitable that the thickness of the photoresist layer be in the range of 0.1 μm to 500 μm, preferably in the range of 1 μm to 200 μm. In the case of preparing a light sensitive lithographic printing plate using the photopolymerizable composition of the present invention, it is appropriate that a coating amount be generally in the range of 0.1 to 10.0 g/m$^2$, preferably in the range of 0.5 to 5.0 g/m$^2$, by dry weight.

In the case of using the photopolymerizable composition of the present invention as a dry film resist, supports are appropriately chosen from films of polyamides, polyolefins, polyesters, vinyl polymers and cellulose esters, etc. and the thickness is preferably between 3 μm and 100 μm. A particularly suitable support film is a transparent polyethylene terephthalate film having a thickness of about 25 to 50 μm. Further in thise case, a preferred protective film is a film made of polyolefins. A particularly preferred protective film is a polyethylene film having a thickness of 20 to 25 μm.

In the case of using the photopolymerizable composition of the present invention for preparing films for photomasks, preferred supports include a polyethylene terephthalate film on which aluminum, aluminum alloys or chromium have been deposited by vacuum evaporation or a polyethylene terephthalate film having provided thereon a color formation layer, etc.

In the case of using the photopolymerizable composition of the present invention as a light sensitive layer in a relief printing plate, preferred supports include an aluminum plate which has been rendered hydrophilic, e.g., an aluminum plate treated with a silicate, an anodically oxidized aluminum plate, a grained aluminum plate, an aluminum plate to which a silicate has been electrically deposited; in addition thereto, there are a zinc plate, a stainless plate, a chromium-treated copper plate, a plastic film or paper sheet which has been rendered hydrophilic, etc.

Further in the case of using the photopolymerizable composition of the present invention for preparing color proof for printing, a film for overhead projectors and a film for a second original pattern, preferred supports include a transparent film such as a polyethylene terephthalate film, a cellulose triacetate film, etc. and a plastic film, the surface of which has been chemically or physically matted.

It is surprising that the ternary photopolymerization initiator system of the present invention exhibits high sensitivity and high strength or a light-hardened layer. In case that the photopolymerizable composition of the present invention is employed for a dry film resist as a result, spray impact resistance of "tent" is enhanced and the reliance of "tent" is improved. Further when the photopolymerizable composition is employed as a lithographic printing plate, life-time for printing is greatly improved and processing costs are reduced. Further in the case of using as a light sensitive layer for photomasks or color proof, strength of images is improved so that life-time of use is enhanced. Further, it is unnecessary to be nervous with handling as in the prior art so that operation efficiency is improved.

The photopolymerizable composition of the present invention further provides excellent developability so that neither scumming nor staining is caused.

Further the photopolymerizable composition of the present invention is stable with the passage of time so that storability of materials is good in the case of using the photopolymerizable composition as light sensitive materials to which light sensitivity has been previously imparted, such as dryfilm resists, light sensitive printing plates, color proof, etc.

Further, the ternary photopolymerization initiator system of the present invention has a high efficiency of changing a color of a leuco dye or dyes simultaneously added and it is thus possible to impart a print out function to a light sensitive lithographic printing plate.

Next, the present invention will be described in more detail with reference to the examples but is not deemed to be limited thereto.

EXAMPLE 1

The following coating solutions containing various photopolymerization initiators but otherwise being identical were prepared.

| | |
| --- | --- |
| Poly(methyl methacrylate) (average molecular weight, 140,000) | 15 g |
| Trimethylolpropane triacrylate | 2.4 g |
| Tetraethylene glycol diacrylate | 6.1 g |
| Photopolymerization initiator system | (amount indicated in Table 1) |
| p-Methoxyphenol | 0.01 g |
| p-Toluenesulfonamide | 1.62 g |
| Malachite green | 0.015 g |
| Methyl ethyl ketone | 45 g |

Each of the coating solutions was coated onto a polyethylene terephthalate film (thickness of 25 μm), respectively, and drying was performed for 2 minutes in an oven at 100° C. to obtain a coated layer having a thickness of about 50 μm. The coated layer was laminated onto a copper-lined glass fiber reinforced epoxy resin plate at 120° C. After putting a step wedge having an optical density difference of 0.15 thereon, the system was exposed to light by 80 counts with a 2 KW super ultra high pressure mercury arc (made by Oak Co., Ltd., a jet printer) under reduced pressure. The polyethylene terephthalate film support was stripped out of the exposed laminate plate. Thereafter, the system was immersed in 1,1,1-trichloroethane for 60 seconds to dissolve the unexposed portions. From the resulting step wedge images, the number of clear steps was read, which was made the value of sensitivity.

On the other hand, a polyethylene film having a thickness of 25 μm was laminated on the unexposed coated layer of the polyethylene terephthalate film. From the sandwich-like laminate, a piece having a size of 10 mm×70 mm was cut out and the entire surface was exposed to light in an amount such that the clear steps became 6 using a 2 KW ultra super high pressure mercury arc (made by Oak Co., Ltd., a jet printer). After exposure followed by the time lapse for 30 minutes or longer, the polyethylene film and the polyethylnene terephthalate film were stripped out of the piece and the photohardened layer was widthrawn. For the purpose of examining the tensile strength of the layer, the piece was attached to a tensile test machine to measure a stress-strain curve. The tensile strength of the layer was evaluated by a yield stress upon exposure by 20 counts.

TABLE 1

| Film No. | | Photopolymerization Initiator System | Amount Added (g) | Sensitivity (step) | Yield Stress (kg/cm) |
|---|---|---|---|---|---|
| 1 | Sample 1 | 4,4'-Bis(diethylamino)benzophenone | 0.04 | 10 | 1.43 |
| | | Benzophenone | 0.15 | | |
| | | Phenyltribromomethylsulfone | 0.37 | | |
| 2 | Comparative Example 1 | 4,4'-Bis(diethylamino)benzophenone | 0.04 | No images were obtained | — |
| 3 | Comparative Example 2 | Benzophenone | 0.15 | No images were obtained | less than 0.02 (could not be measured) |
| 4 | Comparative Example 3 | Phenyltribromomethylsulfone | 0.37 | No images were obtained | less than 0.02 |
| 5 | Comparative Example 4 | 4,4'-Bis(diethylamino)benzophenone | 0.04 | 8 | 0.06 |
| | | Benzophenone | 0.15 | | |
| 6 | Comparative Example 5 | 4,4'-Bis(diethylamino)benzophenone | 0.04 | 9 | 0.51 |
| | | Phenyltribromomethylsulfone | 0.37 | | |
| 7 | Comparative Example 6 | Benzophenone | 0.15 | No images were obtained | less than 0.02 |
| | | Phenyltribromomethylsulfone | 0.37 | | |

As is clear from Table 1, the photopolymerization initiator system (ternary system) of Example 1 in accordance with the present invention is superior in both sensitivity and yield stress to the cases of using the respective components singly (Comparative Examples 1 to 3) and the cases of binary system (Comparative Examples 4 and 5).

EXAMPLE 2

In a manner similra to Example 1, coated layers were prepared using the photopolymerization initiator systems shown in Table 2 and the sensitivity and yield stress were evaluated (Table 2).

In any of the cases, the use of the photopolymerization initiator systems of the present invention indicates that coated layers having high sensitivity and large yield stress are obtained.

TABLE 2

| Film No. | Photopolymerization Initiator System | Amount Added (g) | Sensitivity (step) | Yield Stress (kg/cm) |
|---|---|---|---|---|
| Sample 2 | 4,4'-Bis(diethylamino)benzophenone | 0.04 | 13 | 1.45 |
| | Benzophenone | 0.15 | | |
| | Tris(trichloromethyl)-s-triazine | 0.41 | | |
| Sample 3 | 4,4'-Bis(diethylamino)benzophenone | 0.04 | 11 | 1.76 |
| | Benzophenone | 0.15 | | |
| | 4-Methoxyphenyl-bis(trichloromethyl)-s-triazine | 0.34 | | |

TABLE 2-continued

Photopolymerization Initiator System and Sensitivity as well as Yield Stress

| Film No. | Photopolymerization Initiator System | Amount Added (g) | Sensitivity (step) | Yield Stress (kg/cm) |
|---|---|---|---|---|
| Sample 4 | 4,4'-Bis(diethyl-amino)benzophenone | 0.04 | 10 | 1.25 |
| | Benzophenone | 0.15 | | |
| | 2-Trichloromethyl-5-(1-naphthyl)-1,3,4-oxadiazole | 0.40 | | |
| Sample 5 | 4,4'-Bis(diethyl-amino)benzophenone | 0.04 | 11 | 1.30 |
| | Benzophenone | 0.15 | | |
| | 2-Trichloromethyl-quinazolinone | 0.22 | | |
| Sample 6 | 4,4'-Bis(diethyl-amino)benzophenone | 0.04 | 8 | 0.78 |
| | Benzophenone | 0.15 | | |
| | 2-Trichloromethyl-5-(4-butoxystyryl)-1,3,4-oxadiazole | 0.34 | | |
| Sample 7 | 4,4'-Bis(diethyl-amino)benzophenone | 0.04 | 11 | 1.01 |
| | 4-Chlorobenzophenone | 0.17 | | |
| | 2-Trichloromethyl-quinazolinone | 0.25 | | |
| Sample 8 | 4,4'-Bis(diethyl-amino)benzophenone | 0.04 | 10 | 0.76 |
| | 4-Methoxybenzophenone | 0.17 | | |
| | 2-Trichloromethyl-quinazolinone | 0.25 | | |
| Sample 9 | 4,4'-Bis(dimethyl-amino)benzophenone | 0.03 | 11 | 1.15 |
| | Benzophenone | 0.15 | | |
| | Tris(trichloro-methyl)-s-triazine | 0.41 | | |
| Sample 10 | 4,4'-Bis(dimethyl-amino)benzophenone | 0.03 | 10 | 1.28 |
| | Benzophenone | 0.15 | | |
| | Phenyltribromo-methylsulfone | 0.37 | | |
| Sample 11 | 4,4'-Bis(dimethyl-amino)benzophenone | 0.03 | 9 | 0.65 |
| | Benzophenone | 0.15 | | |
| | 2-Trichloromethyl-quinazoline | 0.25 | | |
| Sample 12 | 4,4'-Bis(diethyl-amino)benzophenone | 0.04 | 11 | 1.04 |
| | Benzophenone | 0.15 | | |
| | Phenyltribromo-methylsulfone | 0.047 | | |
| Sample 13 | 4,4'-Bis(diethyl-amino)benzophenone | 0.04 | 11 | 1.46 |
| | Benzophenone | 0.15 | | |
| | Phenyltribromo-methylsulfone | 0.094 | | |
| Sample 14 | 4,4'-Bis(diethyl-amino)benzophenone | 0.04 | 11 | 1.48 |
| | Benzophenone | 0.15 | | |
| | Phenyltribromo-methylsulfone | 0.19 | | |
| Sample 15 | 4,4'-Bis(diethyl-amino)benzophenone | 0.04 | 11 | 1.55 |
| | Benzophenone | 0.15 | | |
| | Phenyltribromo-methylsulfone | 0.74 | | |
| Sample 16 | 4,4'-Bis(diethyl-amino)benzophenone | 0.04 | 10 | 1.37 |
| | Benzophenone | 0.075 | | |
| | Phenyltribromo-methylsulfone | 0.37 | | |
| Sample 17 | 4,4'-Bis(diethyl-amino)benzophenone | 0.04 | 11 | 1.78 |
| | Benzophenone | 0.30 | | |
| | Phenyltribromo-methylsulfone | 0.37 | | |
| Sample 18 | 4,4'-Bis(diethyl-amino)benzophenone | 0.02 | 11 | 0.95 |
| | Benzophenone | 0.15 | | |
| | Phenyltribromo-methylsulfone | 0.37 | | |
| Sample 19 | 4,4'-Bis(diethyl- | 0.08 | 12 | 1.19 |

TABLE 2-continued

Photopolymerization Initiator System and Sensitivity as well as Yield Stress

| Film No. | Photopolymerization Initiator System | Amount Added (g) | Sensitivity (step) | Yield Stress (kg/cm) |
|---|---|---|---|---|
| | amino)benzophenone | | | |
| | Benzophenone | 0.15 | | |
| | Phenyltribromo-methylsulfone | 0.37 | | |
| Sample 20 | 4,4'-Bis(diethyl-amino)benzophenone | 0.01 | 7 | 0.84 |
| | Benzophenone | 0.04 | | |
| | Phenyltribromo-methylsulfone | 0.09 | | |
| Sample 21 | 4,4'-Bis(diethyl-amino)benzophenone | 0.02 | 9 | 1.02 |
| | Benzophenone | 0.08 | | |
| | Phenyltribromo-methylsulfone | 0.18 | | |
| Sample 22 | 4,4'-Bis(diethyl-amino)benzophenone | 0.08 | 12 | 1.22 |
| | Benzophenone | 0.30 | | |
| | Phenyltribromo-methylsulfone | 0.74 | | |

EXAMPLE 3

Preparation of Print Base Plate

From sandwich-like laminates (Film Nos. 1 to 7) composed of a polyethylene terephthalate film (thickness, 25 μm), a photopolymerizable layer (thickness, 50 μm) and a polyethylene film (thickness, 25 μm), obtained in Example 1, the polyethylene film was stripped off and laminated on both surfaces of an affinitized, dried copper-lined laminate plate (having 100 through holes having diameters of 2.5 mm, 1.5 mm and 1.0 mm, respectively) at 120° C. using an A-24 laminater (manufactrued by Du Pont Co., Ltd.). Photomasks having Land's diameters of 3.0 mm, 2.0 mm and 1.4 mm were laminated onto each of the laminate plates in a conventional manner and exposed (20 counts) using a ultra high pressure mercury arc lamp to form photohardened resist layers on the both surfaces of each of the through holes. The polyethylene terephthalate film support was removed from each surface of the plates and the plates were developed by removing the unexposed resist portions with a 1,1,1-trichloethane spray. With resists other than Film Nos. 2, 3, 4 and 7, each of the through holes was covered with a photohardened layer ("tent"). No faul was observed in any of "tents". Then, the thus developed plates were passed through a high pressure hot water spray (54° C.) to examine spray impact resistance of "tents". The number of the tents destructed during the spraying is shown in Table 3.

TABLE 3

Spray Impact Resistance of Tent

| | Tent Destroyed by High Pressure Spray (%) | | |
|---|---|---|---|
| Film | 2.5 mm | 1.5 mm | 1 mm |
| 1 (Example 1) | 2 | 0 | 0 |
| 5 (Comparative Example 4) | 95 | 90 | 78 |
| 6 (Comparative Example 5) | 28 | 12 | 10 |

It is evident from the above results that the composition of the present invention containing the ternary photopolymerization initiator system is highly sensitive and gives a tent substantially less destructive as compared to the single system or the composition of binary photopolymerization initiators.

EXAMPLE 4

Preparation of Negative Lithographic Printing Plate

Onto an anodically oxidized aluminum plate having a thickness of 0.15 mm, the surface of which had been grained, the following light sensitive solution was coated with a whirler and drying was then performed at 100° C. for 2 minutes to prepare a light sensitive printing plate.

| | |
|---|---|
| Trimethylolpropane triacrylate | 0.38 g |
| Methyl methacrylate-methacrylic acid (90 mols/10 mols) copolymer | 0.62 g |
| Michler's ketone | 0.04 g |
| Benzophenone | 0.02 g |
| Tribromomethylphenylsulfone | 0.02 g |
| Oil blue #603 | 0.010 g |
| p-Methoxyphenol | 0.001 g |
| Leuco crystal violet | 0.008 g |
| Methyl cellosolve acetate | 5 g |
| Methyl ethyl ketone | 5 g |

The light sensitive lithographic printing plate was imagewise exposed and the unexposed portions were removed with a developing solution composed of 1.2 g of sodium hydroxide, 300 ml of isopropyl alcohol and 900 ml of water to obtain a lithographic printing plate.

Using the thus obtained printing plate, printing was performed with a printing machine to obtain clear printed matters of 500,000 sheets.

While the invention has been described in detail and with reference to specific embodiment thereof, it will be apparent to one skilled in the art that various changes and modifications can be made therein without departing from the spirit and scope thereof.

What is claimed is:

1. A photopolymerizable composition having high sensitivity and providing a photohardenable layer having excellent layer strength comprising an addition polymerizable unsaturated compound containing at least two ethylenically unsaturated double bonds in the molecule thereof, a high molecular binder present in an amount of from 10 to 1,000 parts by weight based on 100 parts by weight of the polymerizable unsaturated compound, and photopolymerization initiators, wherein a 4,4-'bis(dialkylamino)-benzophenone represented by general formula I, a benzophenone derivative represented by general formula II and an organic compound selected from the group consisting of compounds represented by general formulae IIIa, IIIb, IIIc, IIId and IIIe are contained in said composition in combination as said photopolymerization initiators;

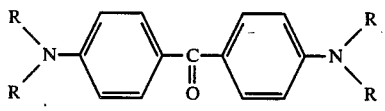

wherein R represents an alkyl, cycloalkyl or hydroxyalkyl group having 1 to 6 carbon atoms or is combined with another R substituted on the same nitrogen atom to form tetramethylene, pentamethylene or oxybisethylene;

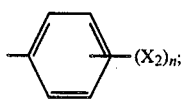

wherein $R^1$ represents a hydrogen atom or

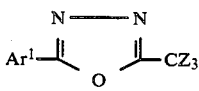

$X_1$ and $X_2$ each represents an alkyl group, an alkoxy group, a carboxy group, an alkoxycarbonyl group, an aryloxycarbonyl group or a halogen atom; m and n each represents 0, 1 or 2 and when m and n each represents 2, $X_1$ and $X_2$ may be the same or different;

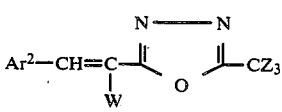

$Ar^1$: a substituted or unsubstituted phenyl or naphthyl group
Z: a chlorine or bromine atom $$Ar^2-CH=C-\overset{N\rule{1cm}{0.4pt}N}{\underset{O}{\overset{|}{\bigg\langle}}}CZ_3 \qquad \text{IIIb}$$
$$\phantom{Ar^2-CH=}W$$

$Ar^2$: a substituted or unsubstituted aryl group
W: a hydrogen atom, an alkyl group or an aryl group
Z: a chlorine or bromine atom $$Ar^3-SO_2CZ_3 \qquad \text{IIIc}$$

$Ar^3$: a substituted or unsubstituted phenyl or naphthyl group
Z: a chlorine or bromine atom

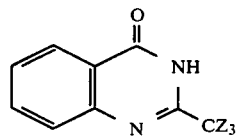

Z: a chlorine or bromine atom

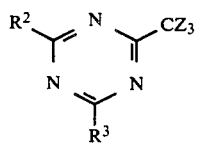

$R^2$: $CZ_3$ or a substituted or unsubstituted phenyl or naphthyl group
$R^3$: $CZ_3$, $NH_2$, $NHR^4$, $N(R^4)_2$, $SR^4$, $OR^4$, or $R^4$
$R^4$: an alkyl, aryl or alkenyl group
Z: a chlorine or bromine atom
wherein each of said compounds of formulae I to II and compound having group III is contained in an amount of 0.1 to 50 parts by weight per 100 parts by weight of the polymerizable unsaturated compound, wherein the weight ratio of the compound represented by formula I to that of formula II is 1:20-10:1, wherein the weight ratio of the compound represented by formula I to that containing group of formula III is 1:20-10:1 and wherein the weight ratio of the compound represented by formula II to that containing group of formula III is 1:10-10:1.

2. A photopolymerizable composition as claimed in claim 1, wherein $X_1$ and $X_2$ each represents an alkyl group containing 1-6 carbon atoms, an alkoxy group containing 1-6 carbon atoms, a carboxy group, an alkoxycarbonyl group containing 1-6 carbon atoms in the alkyl moiety thereof, an aryloxy carbonyl group containing 6-10 carbon atoms in the aryl moiety thereof, Cl, Br, F or I.

3. A photopolymerizable composition as claimed in claim 1, wherein said Ar' is a phenyl or naphthyl group substituted with an alkyl group having 1-6 carbon atoms, an alkoxy group having 1-6 carbon atoms, Cl, Br, F, $NO_2$, CN or methylene dioxy group.

4. A photopolymerizable composition as claimed in claim 1, wherein said $Ar^2$ is an aryl group substituted with an alkyl group having 1-6 carbon atoms, an alkoxy group having 1-6 carbon atoms, Cl, Br, F, $NO_2$, CN, phenyl group, phenoxy group or acetoxy group.

5. A photopolymerizable composition as claimed in claim 1, wherein said W represents a hydrogen atom, an alkyl group containing 1-6 carbon atoms or an aryl group containing 6-10 carbon atoms.

6. A photopolymerizable composition as claimed in claim 1, wherein said $Ar^3$ is a phenyl or naphthyl group substituted with an alkyl group having 1-6 carbon atoms, an alkoxy group having 1-6 carbon atoms, Cl, Br, F, or $NO_2$.

7. A photopolymerizable composition as claimed in claim 1, wherein said $R^2$ is a phenyl or naphthyl group substituted with an alkyl group having 1-6 carbon atoms, an alkoxy group having 1-6 carbon atoms, Cl, Br, F, $NO_2$ or CN.

8. A photopolymerizable composition as claimed in claim 1, wherein said $R^4$ represents an alkyl group containing 1-6 carbon atoms, an aryl group containing 6-10 carbon atoms and an alkenyl group containing 1-6 carbon atoms.

9. A photopolymerizable composition as claimed in claim 1, wherein the total amount of the compounds represented by formula I to III is 1 to 30 parts by weight per 100 parts by weight of the polymerizable unsaturated compound.

10. A photopolymerizable composition as claimed in claim 1, wherein said polymerizable unsaturated compound is a compound selected from the group consisting of acrylic acid and methacrylic acid esters of a polyol, a bisacrylamide, a bismethacrylamide, a polyfunctional monomer containing urethane groups therein and methacrylurethane oligomers.

11. A photopolymerizable composition as claimed in claim 1, wherein the composition further contains at least one of a thermal polymerization inhibitor, a plasticizer, a dyestuff, a color changing agent, an unsaturated compound having one ethylenically unsaturated double bond, and an adhesion accelerator.

12. A photopolymerizable composition as claimed in claim 10, wherein said polymerizable unsaturated compound is an acrylurethane.

* * * * *